US006759098B2

(12) United States Patent
Han et al.

(10) Patent No.: US 6,759,098 B2
(45) Date of Patent: Jul. 6, 2004

(54) PLASMA CURING OF MSQ-BASED POROUS LOW-K FILM MATERIALS

(75) Inventors: Qingyuan Han, Columbia, MD (US); Carlo Waldfried, Falls Church, VA (US); Orlando Escorcia, Falls Church, VA (US); Ralph Albano, Columbia, MD (US); Ivan L. Berry, III, Ellicott City, MD (US); Jeff Jang, Calabasas, CA (US); Ian Ball, San Diego, CA (US)

(73) Assignees: Axcelis Technologies, Inc., Beverly, MA (US); Chemat Technology, Inc., Northridge, CA (US)

( * ) Notice: Subject to any disclaimer, the term of this patent is extended or adjusted under 35 U.S.C. 154(b) by 0 days.

(21) Appl. No.: 09/906,276

(22) Filed: Jul. 16, 2001

(65) Prior Publication Data

US 2002/0102413 A1 Aug. 1, 2002

Related U.S. Application Data

(63) Continuation-in-part of application No. 09/681,332, filed on Mar. 19, 2001, now Pat. No. 6,558,755, which is a continuation-in-part of application No. 09/528,835, filed on Mar. 20, 2000, now Pat. No. 6,576,300.

(51) Int. Cl.$^7$ .............................. B05D 3/02; B05D 3/06; C08J 7/18; H01L 21/316; H01L 21/3105
(52) U.S. Cl. ....................... 427/536; 427/539; 427/489; 427/397.7; 438/789
(58) Field of Search ................................ 427/489, 536, 427/539, 535, 397.7, 397.8; 438/788, 789, 787, 790

(56) References Cited

U.S. PATENT DOCUMENTS

| | | |
|---|---|---|
| 3,615,272 A | 10/1971 | Collins et al. |
| 4,636,440 A | 1/1987 | Jada |
| 4,670,299 A | 6/1987 | Fukuyama et al. |
| 4,749,631 A | 6/1988 | Haluska et al. |
| 4,756,977 A | 7/1988 | Haluska et al. |
| 4,808,653 A | 2/1989 | Haluska et al. |
| 4,822,697 A | 4/1989 | Haluska et al. |
| 4,842,888 A | 6/1989 | Haluska et al. |
| 4,847,162 A | 7/1989 | Haluska et al. |
| 4,999,397 A | 3/1991 | Weiss et al. |
| 5,008,320 A | 4/1991 | Haluska et al. |
| 5,010,159 A | 4/1991 | Bank et al. |
| 5,063,267 A | 11/1991 | Hanneman et al. |
| 5,116,637 A | 5/1992 | Baney et al. |
| 5,210,160 A | 5/1993 | Saive et al. |
| 5,262,201 A | 11/1993 | Chandra et al. |
| 5,290,394 A | 3/1994 | Sasaki |
| 5,416,190 A | 5/1995 | Mine et al. |
| 5,523,163 A | 6/1996 | Ballance et al. |
| 5,547,703 A | 8/1996 | Camilletti et al. |
| 5,618,878 A | 4/1997 | Syktich et al. |
| 5,767,014 A | 6/1998 | Hawker et al. |
| 5,853,808 A * | 12/1998 | Arkles et al. ............... 427/515 |
| 5,935,646 A * | 8/1999 | Raman et al. ............... 427/535 |
| 5,961,851 A | 10/1999 | Kamarehi et al. |
| 6,080,526 A * | 6/2000 | Yang et al. .................. 427/553 |
| 6,107,357 A | 8/2000 | Hawker et al. |
| 6,143,360 A | 11/2000 | Zhong |
| 6,156,671 A | 12/2000 | Chang et al. |
| 6,184,260 B1 | 2/2001 | Zhong |
| 6,231,989 B1 | 5/2001 | Chung et al. |
| 6,245,175 B1 * | 6/2001 | Hotta et al. .................. 156/172 |
| 6,284,050 B1 * | 9/2001 | Shi et al. ..................... 427/509 |
| 6,485,815 B1 * | 11/2002 | Jeong et al. ................. 428/210 |
| 6,558,755 B2 * | 5/2003 | Berry, III et al. ........... 427/489 |
| 6,576,300 B1 * | 6/2003 | Berry, III et al. ........... 427/489 |
| 6,670,709 B2 * | 12/2003 | Usami ......................... 257/758 |
| 2002/0136910 A1 * | 9/2002 | Hacker et al. .............. 427/508 |
| 2002/0182891 A1 * | 12/2002 | Matsuura .................... 438/781 |
| 2003/0008576 A1 * | 1/2003 | Chang et al. ............... 438/704 |
| 2003/0054656 A1 * | 3/2003 | Soda .......................... 438/710 |
| 2003/0087534 A1 * | 5/2003 | Mallikarjunan et al. .... 438/781 |
| 2003/0126951 A1 * | 7/2003 | Sanders et al. ............. 76/107.1 |
| 2003/0190807 A1 * | 10/2003 | Soda et al. ................. 438/689 |
| 2003/0211746 A1 * | 11/2003 | Chen et al. ................. 438/700 |

FOREIGN PATENT DOCUMENTS

| | | | |
|---|---|---|---|
| JP | 59-178749 | | 10/1984 |
| JP | 60086017 A | * | 5/1985 |
| JP | 63-107122 | | 5/1988 |
| JP | 11-008450 | * | 1/1999 |

OTHER PUBLICATIONS

Abstract for JP59–178749A to Takeda (Funitsu LTD), Oct. 1984.*
Abstract for JP 63–107122 A to Fukuyama et al (Fujitsu LTD), May 1988.*
Glasser et al., Effect of the $H_2O$/TEOS Ratio Upon the Preparation and Nitridation of Silica Sol/Gel Films; Journal of Non–Crystalline Solids; 1984 no month; 13 pgs.; vol. 63; Elsevier Science Publishers B.V.; North–Holland, Amsterdam.
Annapragada R. et al., "Plasma Treatment to Improve Adhesion of Low–K Materials", *Electrochemical Society Proceedings*, Electrochemical Society, Pennington, NJ, vol. 99–31, Oct. 17, 1999, pp. 303–309.

(List continued on next page.)

Primary Examiner—Marianne Padgett
(74) Attorney, Agent, or Firm—Dinsmore & Shohl LLP

(57) ABSTRACT

Low dielectric constant film materials with improved elastic modulus. The method of making such film materials involves providing a porous methyl silsesquioxane based dielectric film material produced from a resin molecule containing at least 2 Si—$CH_3$ groups and plasma curing the porous film material to convert the film into porous silica. Plasma curing of the porous film material yields a film with improved modulus and outgassing properties. The improvement in elastic modulus is typically greater than or about 100%, and more typically greater than or about 200%. The plasma cured porous film material can optionally be annealed. The annealing of the plasma cured film may reduce the dielectric constant of the film while maintaining an improved elastic modulus as compared to the plasma cured porous film material. The annealed, plasma cured film has a dielectric constant between about 1.1 and about 2.4 and an improved elastic modulus.

19 Claims, No Drawings

OTHER PUBLICATIONS

Liu P. T. et al., "The Effects of Plasma Treatment for Low Dielectric Constant Hydrogen Silsesquioxane (HSQ)" *Thin Solid Films,* Elsevier–Sequoia S.A. Lausanne, CH, vol. 332, No. 1–2, Nov. 2, 1998, pp. 345–350.

Liou H–C et al., "Effect of Curing Temperature on the Mechanical Properties of Hydrogen Silsesquioxane Thin Films", *Thin Solid Films,* Elsevier–Sequoia S.A. Lausanne, CH, vol. 335, No. 1–2, Nov. 19, 1998, pp. 186–191.

Padovani A.M. et al., "Porous Methylsilsesquioxane for Low–K Dielectric Applications", Database Accession No. 7077483 Electrochemical and Solid–State Letters, Abstract, Nov. 2001, vol. 4, No. 11, pp. F–25—F–28.

* cited by examiner

PLASMA CURING OF MSQ-BASED POROUS LOW-K FILM MATERIALS

CROSS-REFERENCE TO RELATED APPLICATIONS

This application is a continuation-in-part of U.S. patent application Ser. No. 09/681,332, filed Mar. 19, 2001 now U.S. Pat. No. 6,558,75, now on issued May 6, 2003 and entitled "PLASMA CURING PROCESS FOR POROUS SILICA THIN FILM" which is a continuation-in-part of U.S. patent application Ser. No. 09/528,835, filed Mar. 20, 2000 Now U.S. Pat. No. 6,576,300, now on issued Jun. 10, 2003 and entitled "HIGH MODULUS, LOW DIELECTRIC CONSTANT COATINGS", the disclosures of which are incorporated herein by reference.

STATEMENT REGARDING FEDERALLY SPONSORED RESEARCH OR DEVELOPMENT

This invention was made with Government support under contract no. F33615-98-C-1336 awarded by the Department of the Air Force. The Government has certain rights in this invention.

BACKGROUND OF THE INVENTION

This invention relates generally to porous dielectric film materials for use in electronic and semiconductor devices, such as integrated circuits. More particularly, the invention relates to plasma cured, porous methylsilsesquioxane (MSQ) based dielectric film materials having an improved elastic modulus and a low dielectric constant and to methods of making such films.

As the semiconductor industry introduces new generations of integrated circuits (IC's) having higher performance and greater functionality, the density of the elements that form those IC's is increased, while the dimensions, size and spacing between the individual components or elements is reduced. While in the past such reductions were limited only by the ability to define the structures photolithographically, device geometries having dimensions as small as 0.25 micron ($\mu$m) or smaller have created new limiting factors, such as the conductivity of the metallic elements or the dielectric constant of the insulating material(s) used between the elements. For example, for any two adjacent conductive paths, as the distance between the conductors decreases, the resulting capacitance (a function of the dielectric constant (k) of the insulating material divided by the distance between conductive paths) increases. This increased capacitance results in increased capacitive coupling between the conductors, increased power consumption, and an increase in the resistive-capacitive (RC) time constant. Therefore, the continual improvement in semiconductor IC performance and functionality is dependent upon developing materials that form a dielectric film with a lower dielectric constant (k) than that of the most commonly used material, silicon oxide, thus resulting in reduced capacitance. As the dimensions of these devices get smaller and smaller, significant reductions in capacitance, into the so-called "ultra low-k" regime (e.g., k<2.5), will be required.

The initial approach for providing reduced-k insulating films was the doping of the silicon oxide material (k~3.9) with other components that would reduce the k value. For example, doping silicon oxide with fluorine typically reduces the value of k, but only to about 3.5–3.9. Processes for forming these doped films often advantageously use the same or similar methods that are used for forming undoped silicon oxide films. Hence the integration of fluorine doped films into the typical process flow is generally easily accomplished. However, as such fluorine doped films offer only a small decrease in k, other solutions having lower dielectric constants are needed. Finally, the stability of such fluorine containing films with regard to moisture is problematic.

A number of families of organic polymers were another preliminary solution for providing low-k dielectric films. Typically, organic polymers can form dielectric films where a k in the range of 2.5 or higher is possible. Generally, such dielectric films are formed by first applying a solution of an appropriate pre-polymer to a substrate. The substrate is then heated until the pre-polymer crosslinks and polymerizes to the degree desired and a solid film formed. As the organic material is applied as a liquid, some degree of surface planarization is provided for and often no additional planarization is needed. However, while such organic polymer films provide both a lower dielectric constant and enhanced planarization as compared to silicon oxide films, formed for example by chemical vapor deposition, for other film properties, such silicon oxide films have advantages. For example, organic materials generally have limited thermal stability above 450 degrees Centigrade (° C.); they often exhibit less adhesion to common metals, such as tungsten (W) and aluminum (Al); and the mechanical strength of such organic films is much less than that of silicon oxide. Finally, such organic films typically provide for k values only in the "low-k" regime (e.g., k=2.7–3.0).

Thin film dielectric coatings on electric devices are known in the art. For instance, U.S. Pat. Nos. 4,749,631 and 4,756,977, to Haluska et al., disclose silica based coatings produced by applying solutions of silicon alkoxides or hydrogen silsesquioxane, respectively, to substrates and then heating the coated substrates to a temperature between 200 and 1000° C. The dielectric constant of these coatings is often too high for certain electronic devices and circuits.

U.S. Pat. Nos. 4,847,162 and 4,842,888, to Haluska et al., teach the formation of nitrided silica coatings by heating hydrogen silsesquioxane resin and silicate esters, respectively, to a temperature between 200 and 1000° C. in the presence of ammonia. These references teach the use of anhydrous ammonia so that the resulting coating has about 1 to 2% by weight nitrogen incorporated therein.

Glasser et al., Journal of Non-Crystalline Solids, 64 (1984) pp. 209–221, teaches the formation of ceramic coatings by heating tetraethoxysilane in the presence of ammonia. This reference teaches the use of anhydrous ammonia and that the resulting silica coatings are nitrided.

U.S. Pat. No. 4,636,440, to Jada, discloses a method of reducing the drying time for a sol-gel coated substrate comprising exposing the substrate to aqueous quaternary ammonium hydroxide and/or alkanol amine compounds. Jada requires that the coating be dried prior to heating. It is specifically limited to hydrolyzed or partially hydrolyzed silicon alkoxides.

U.S. Pat. No. 5,262,201, to Chandra, and U.S. Pat. No. 5,116,637, to Baney et al., teach the use of basic catalysts to lower the temperature necessary for the conversion of various preceramic materials, all involving hydrogen silsesquioxane, to ceramic coatings. These references teach the removal of solvent before the coating is exposed to the basic catalysts.

U.S. Pat. No. 5,547,703, to Camilletti et al., teaches a method for forming low dielectric constant Si—O containing coatings on substrates comprising heating a hydrogen silsesquioxane resin successively under wet ammonia, dry ammonia, and oxygen. The resultant coatings have dielectric constants as low as 2.42 at 1 MHz. This reference teaches the removal of solvent before converting the coating to a ceramic.

U.S. Pat. No. 5,523,163, to Balance et al., teaches a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. The reference teaches the removal of solvent before converting the coating to a ceramic.

U.S. Pat. No. 5,618,878, to Syktich et al., discloses coating compositions containing hydrogen silsesquioxane resin dissolved in saturated alkyl hydrocarbons useful for forming thick ceramic coatings. The alkyl hydrocarbons disclosed are those up to dodecane. The reference does not teach exposure of the coated substrates to basic catalysts before solvent removal.

U.S. Pat. No. 6,231,989, to Chung et al., entitled A METHOD OF FORMING COATINGS, discloses a method of making porous network coatings with low dielectric constants. The method comprises depositing a coating on a substrate with a solution comprising a resin containing at least 2 Si—H groups and a solvent in a manner in which at least 5 volume % of the solvent remains in the coating after deposition. The coating is then exposed to an environment comprising a basic catalyst and water. Finally, the solvent is evaporated from the coating to form a porous network. If desired, the coating can be cured by heating to form a ceramic. Films made by this process have dielectric constants in the range of 1.5 to 2.4 with an elastic modulus of about 2–3 GPa.

In an approach for providing a silicon oxide layer having a planar surface, spin-on glass (SOG) compositions have been prepared utilizing polyorganosilsesquioxanes; for example, see U.S. Pat. No. 4,670,299 issued to Fukuyama et al. (Fukuyama '299). The SOG compositions of Fukuyama '299 are silylated polyorganosilsesquioxanes. The compositions are applied in a manner similar to that described previously for the organic polymers and then heated to form a solid polymerized film. The advantage of films of this type, i.e. films of organic polysilica in the form of an polyorganosilsesquioxanes (POSQ), is that, (1) they provide for films with low dielectric constants (k=2.6–3.0), and (2) they maintain the higher mechanical strengths of silicon oxide-type materials.

However, it would be advantageous to have a final dielectric film that combines the advantages of a film formed from organic polysilicas such as polyorganosilsesquioxanes with an even lower dielectric constant (k<2.5). The most likely method for achieving this result is to blend the POSQ with another substance with a lower dielectric constant. The substance with the lowest dielectric constant is air (k=1.0). Thus, to achieve lower dielectric constants, porosity can be introduced into the POSQ material.

Several methods have been pursued to induce porosity into low dielectric materials, such as organic, low-k polymers, or organic polysilica, low-k polymers. One such method is the synthesis of a block copolymer composed of a high thermal stability, high $T_g$ low-k polymer and a second (organic) polymer which is more easily thermally degradable. This method is purported to have the advantage of forming a closed-cell, porous structure upon thermel curing of the material. See Iledrick. et al. (1993) *Polymer* 34:4717 and Hendrick, et al. (1995) *Polymer* 36:4855. However, this method is hampered by difficulties in controlling the synthesis and processing steps, and limits in the thermal stability of the polymer material. Another method utilizes a graft polymerization of a porogenic (i.e., porosity-inducing) organic side-polymer onto a high thermal stability, high $T_g$ low-k polymer to form a porous material after thermal treatment; see U.S. Pat. Nos. 6,107,357 and 5,767,014 issued to Hawker, et al. However, this method also introduces synthetic and processing complexities into the porosity-inducing method.

However, porous films are mechanically weak by nature. Weak films would fail the Chemical Mechanical Polishing (CMP) process employed to planarize the wafer surface during chip manufacturing. The mechanical properties of a porous film are a function of the porosity of the film. Naturally, higher porosity results in lower dielectric constant but poorer mechanical properties. Thus, a porous film with a combination of low dielectric constant and good mechanical properties is needed.

SUMMARY OF THE INVENTION

The present invention meets that need by providing a porous dielectric film material with a low dielectric constant and an improved elastic modulus. The method of making the film material involves providing a porous MSQ-based dielectric film material, having a first dielectric constant and having a first elastic modulus, wherein the porous film material is produced from a resin molecule containing at least 2 Si—$CH_3$ groups. The film is plasma cured to reduce an amount of Si—$CH_3$ bonds and to produce an $SiO_x$-containing plasma cured porous film material having a second dielectric constant which is comparable to the first dielectric constant and having a second elastic modulus which is greater than the first elastic modulus, and wherein x is a number between 1 and 2. The increase in elastic modulus is typically greater than or about 100%, and more typically greater than or about 200%.

The plasma cured porous film material can optionally be annealed to provide an annealed, plasma cured porous film material having a third dielectric constant and having a third elastic modulus. Thermal annealing of the plasma cured porous film material maintains or reduces the dielectric constant of the film while maintaining the increase in the elastic modulus as compared to the elastic modulus before the anneal. The annealed, plasma cured porous film material has a dielectric constant in the range of from about 1.1 to about 3.5. The annealing temperature is typically less than or about 450° C., and the annealing time is typically no more than or about 60 minutes.

Accordingly, it is an object of the present invention to produce dielectric film materials having improved elastic modulus, low dielectric constant, improved thermal stability, improved outgassing characteristics, and superior integration properties.

DETAILED DESCRIPTION OF THE INVENTION

The present invention is based on the discovery that plasma curing porous MSQ-based films increases the elastic modulus of the film without the necessity of thermally curing the film. Plasma curing reduces the amount of Si—$CH_3$ bonds remaining without losing the low density structure of the film.

Plasma curing can generate a notable amount of polar species in the film, which can be undesirable in some applications. The present invention is also based on the discovery that applying thermal annealing to plasma cured porous MSQ-based dielectric films produces a low dielectric constant, improved modulus film material.

The methods of the present invention are particularly applicable to the deposition of coatings on electronic devices or electronic circuits where they can serve as interlevel dielectric layers, doped dielectric layers to produce transistor like devices, pigment loaded binder systems containing silicon to produce capacitor and capacitor like devices, multilayer devices, 3-D devices, silicon on insulator devices, super lattice devices, and the like. However, the choice of substrates and devices to be coated by the instant invention is limited only by the need for thermal and chemical stability of the substrate at the temperature and pressure used in the present invention. As such, the coatings of the present invention can be used on substrates such as plastics including, for example, polyimides, epoxies, polytetrafluoroethylene and copolymers thereof, polycarbonates, acrylics and polyesters, ceramics, leather, textiles, metals, and the like.

As used in the present invention, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not a limited to, silica-based devices, gallium arsenide based devices, silicon carbide based devices, focal plane arrays, optoelectronic devices, photovoltaic cells and optical devices.

A porous MSQ-based dielectric film is needed as a starting material for the present invention. This thin film coating, which comprises silicon, oxygen, and carbon, can be formed from porous organic-substituted polysilica and an organic porogen. Typical ultra low-k porous dielectric MSQ-based materials, made by spin-on processing, for use with the present invention are available from Chemat Technologies, Inc. (Northridge, Calif.) and JSR Corporation (Tokyo, Japan). One method of making such a porous dielectric film is described below.

A method of producing the porous MSQ-based dielectric film material starts with depositing a thin film coating of porous organic-substituted polysilica on a substrate. The thin film coating of porous polysilica is produced by spinning a thin film of porous organic-substituted polysilica from a blend solution. The blend solution comprises the following components in a suitable solvent (i.e., alcohol): (1) a thermally stable, low dielectric constant, organic-inorganic hybrid host polymer which contains at least 2 Si—$CH_3$ groups; (2) a thermally degradable organic polymer acting as a porogen (i.e., a porosity-inducing material); and alternatively including (3) other additives (e.g., surfactants).

The thermally stable, low dielectric constant host polymer is an organic-inorganic hybrid polymer (i.e., organic polysilica, specifically, polyorganosilsesquioxane (POSQ)) of the type $(RSiO_x)_n$, where R is an organic substituent, such as, for example, a methyl, ethyl, or phenyl group, and where x is a number between 1 and 2.

The porogen or porosity-inducing material is a thermally degradable organic polymer, which upon thermal curing, completely degrades into small, gaseous, non-reactive species at a temperature above the crosslinking temperature of the host polymer. These small, gaseous, non-reactive degradation species then diffuse out of the host material, leaving behind hollow pores (i.e., porosity) in the host polymer. The crosslinking temperature of the host polymer (e.g., MSQ, etc.) is usually on the order of 100–200° C., so the degradation temperature of the organic porogen needs to be well above this temperature (e.g., 250–350° C.).

Suitable organic porogens, with degradation temperatures of 300° C. or higher, must be large enough (e.g., >10 Å) to leave behind well-defined pores in the host material, but not so large (e.g., <100 Å) that the pore sizes are a significant percentage of the overall width of the film of the low-k material. Further, it is preferable if the pores generated in the host material are of regular, and reproducible, geometric shape (e.g., spherical pores of all the same diameter and volume). Generally, organic dendrimer polymers or hyperbranched organic polymers are the best candidates as porogens with these specific properties, substantially improving reproducibility over linear polymers. Linear polymers may have greater molecular weight and size distributions, and are much less adept at producing regular (i.e., spherical) and reproducible pores and pore sizes in a material.

These thin films can be thermally cured to eliminate the porogen. The result is a film of porous, ultra low-k material. Alternative embodiments involving other methods can also be employed to produce the porous polysilica.

Although such porous MSQ-based dielectric materials having low dielectric constants are desirable in the production of certain electronic and semiconductor devices, it would be advantageous to have a film with a higher elastic modulus.

In order to raise the elastic modulus of the porous MSQ-based dielectric film material, it is exposed to a plasma cure. The plasma cure can be done by radio frequency (RF), inductive coupled, RF capacitive coupled, helical resinator, microwave downstream, and microwave electron cyclotron resonance (ECR) plasma. The plasma cure improves the mechanical properties of the porous MSQ-based dielectric film material, increasing material hardness while maintaining the dielectric pore, structure, density, and electrical properties.

In a typical plasma curing process, the wafer is quickly heated in a rapid temperature ramp-up step to the desired temperature, and the wafer is plasma cured.

The exact conditions for the plasma cure depend upon what type of plasma is being used. Examples of typical microwave plasma cure conditions for a 200 mm wafer are shown below.

| | |
|---|---|
| Microwave Plasma Power: | 500 W–3000 W |
| Wafer Temperature: | 80° C.–350° C. |
| Process Pressure: | 1.0 Torr–4.0 Torr |
| Plasma Cure Time: | <120 seconds |
| Plasma Gases: | $H_2/N_2/CF_4/O_2$ |
| $N_2H_2$ Flow Rate: | >0–4000 sccm |
| $O_2$ Flow Rate: | >0–4000 sccm |
| $CF_4$ Flow Rate: | >0–400 sccm |

The elastic modulus of the plasma cured porous film material is increased as compared to a furnace (thermally) cured porous film material which would have an elastic modulus of between about 1.0 and about 3.5 GPa when the dielectric constant is about 2.0. This increase in the elastic modulus is typically greater than or about 100%, and more typically greater than or about 200%. Typically, the elastic modulus of the plasma cured porous film material is greater than or about 3 GPa, and more typically between about 3 GPa and about 10 GPa.

The plasma cured porous MSQ-based dielectric film material of the present invention has improved chemical stability and improved dimensional stability. By improved chemical stability, we mean that the film is more resistant to chemicals, such as cleaning solutions and chemical polishing solutions, and plasma damaging during photoresist ashing and dry etching processes.

In addition, as compared to thermal curing, the plasma cure significantly reduces or eliminates the outgassing of oliomeric polysilica and other substances from the porous films. However, plasma cure can generate a notable amount of polar species in the film.

The plasma cured film materials can optionally be annealed using any type of thermal exposure to reduce the dielectric constant, if desired. For example, the plasma cured film can be placed in a conventional oven until the polar species are removed, such as at 400° C. for 30 minutes. Another process which can be used involves annealing the plasma cured film materials in a Rapid Thermal Processing (RTP) chamber in order to reduce the dielectric constant. The plasma cured film is annealed at a typical temperature for a sufficient time, and cooled to about 100° C.

Typical operating conditions for the RTP process are shown below.

| Ramp rate: | 15° C./sec |
|---|---|
| Wafer Temperature: | 350–450° C. |
| Annealing Time: | <180 seconds |
| Process Pressure: | atmospheric |

The dielectric constant of the annealed, plasma cured film materials may be reduced as compared to the plasma cured MSQ-based dielectric films. The dielectric constant of the annealed, plasma cured films is typically in the range of from about 1.1 to about 3.5 and more typically in the range of from about 1.8 to about 2.4.

In still another embodiment of the present invention, the porous MSQ-based dielectric film material is plasma cured to a thickness of between about 0.3 to about 0.7 microns ($\mu$m) and employed in a damascene process. Alternatively, the film can be plasma cured to a thickness of between about 0.7 to about 1.25 $\mu$m and employed in a double damascene process. Alternatively, the porous MSQ-based film can be plasma cured to a thickness of between about 1.3 to about 1.5 $\mu$m on a patterned wafer and employed as an interlayer dielectric or passivation layer.

In still another embodiment, one or more plasma cured or annealed and plasma cured porous MSQ-based dielectric film layers are formed to provide a microelectronic device having a multi-layer interconnect structure.

In order that the invention may be more readily understood, reference is made to the following examples, which are intended to illustrate the invention, but not limit the scope thereof.

EXAMPLE 1

Different plasma conditions and the resulting properties for typical MSQ-based dielectric film material are shown in Table 1 below.

While certain representative embodiments and details have been shown for purposes of illustrating the invention, it will be apparent to those skilled in the art that various changes in the compositions and method disclosed herein may be made without departing from the scope of the invention, which is defined in the appended claims.

What is claimed is:

1. A method of making a plasma cured material comprising:
   providing a porous methyl silsesquioxane-based dielectric film material, having a first dielectric constant and having a first elastic modulus, wherein the porous film material is produced from a resin molecule containing at least 2 Si—$CH_3$ groups; and
   plasma curing the porous film material to reduce an amount of Si—$CH_3$ bonds and to produce an $SiO_x$-containing plasma cured porous film material having a second dielectric constant and having a second elastic modulus which is greater than the first elastic modulus, and wherein x is a number between 1 and 2.

2. The method of claim 1 wherein the porous film material is plasma cured at a plasma power in the range of about 500 W to about 3000 W.

3. The method of claim 1 wherein the porous film material is plasma cured at a temperature less than or about 350° C.

4. The method of claim 1 wherein the porous film material is plasma cured at a temperature in the range of about 150° C. to about 350° C.

5. The method of claim 1 wherein the porous film material is plasma cured at a temperature in the range of about 270° C. to about 300° C.

6. The method of claim 1 wherein the porous film material is plasma cured at process pressure in the range of about 1 to about 4 Torr.

7. The method of claim 1 wherein the porous film material is plasma cured for a time in the range of about 15 to about 120 seconds.

8. The method of claim 1 wherein the plasma is selected from $H_2$ plasma gas, $N_2$ plasma gas, $CF_4$ plasma gas, $O_2$ plasma gas, or a combination thereof.

9. The process of claim 1 wherein the increase in elastic modulus between the first elastic modulus of the porous film material and the second elastic modulus of the plasma cured porous film material is greater than or about 100%.

10. The process of claim 1 wherein the increase in elastic modulus between the first elastic modulus of the porous film material and the second elastic modulus of the plasma cured porous film material is greater than or about 200%.

TABLE 1

Plasma conditions and properties of MSQ-based dielectric film materials

| Process | Condition | Thickness Reduction (%) | R.I. Increase (%) | Contact Angle After Plasma Cure | Elastic Modulus | Dielectric Constant |
|---|---|---|---|---|---|---|
| $He/H_2$ | 60 s/3 Torr/350° C. | 3.25 | 1.37 | 50 | 1 | 2.30 |
| $Ar/H_2$ | 60 s/3 Torr/250° C. | 2.21 | 0.98 | 55 | | |
| $N_2H_2$ | 60 s/1 Torr/285° C. | 7.70 | 1.60 | 5 | 1.6 | 2.35 |
| $N_2H_2 + CF_4$ | 60 s/1 Torr/285° C. | 14.05 | −0.04 | 60 | 2.5 | 2.35 |
| $N_2H_2 + O_2 + CF_4$ | 60 s/2.5 Torr/285° C. | 29.52 | 0.49 | 29 | 5 | 6.00 |
| Control | | 0.07 | 0.00 | 90 | 1 | 2.30 |

11. The method of claim 1 wherein the second elastic modulus of the plasma cured porous film material is greater than or about 3 GPa.

12. The method of claim 1 wherein the second elastic modulus of the plasma cured porous film material is between about 3 GPa and about 10 GPa.

13. The method of claim 1 wherein a level of outgassing of the plasma cured porous film material is significantly reduced or eliminated compared to a thermally cured porous methyl silsesquioxane-based dielectric film material.

14. The method of claim 1 further comprising annealing the plasma cured porous film material to provide an annealed, plasma cured porous film material having a third dielectric constant which is less than or substantially equal to the second dielectric constant.

15. The method of claim 14 wherein the plasma cured porous film material is annealed at a temperature less than or about 450° C.

16. The method of claim 14 wherein the plasma cured porous film material is annealed at a temperature in the range of about 350° C. to about 450° C.

17. The method of claim 14 wherein the plasma cured porous film material is annealed for no more than or about 60 minutes.

18. The method of claim 14 wherein the third dielectric constant of the annealed, plasma cured porous film material is in the range of from about 1.1 to about 3.5.

19. The method of claim 14 wherein the third dielectric constant of the annealed, plasma cured porous film material is in the range of from about 1.8 to about 2.4.

* * * * *